(12) United States Patent  
Tamaya et al.

(10) Patent No.: US 8,391,326 B1  
(45) Date of Patent: Mar. 5, 2013

(54) LASER LIGHT SOURCE MODULE

(75) Inventors: Motoaki Tamaya, Chiyoda-ku (JP); Kenji Okuda, Chiyoda-ku (JP); Chise Nanba, Chiyoda-ku (JP); Akira Nakamura, Chiyoda-ku (JP); Junichi Aizawa, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 12/865,258

(22) PCT Filed: Mar. 18, 2008

(86) PCT No.: PCT/JP2008/054958  
§ 371 (c)(1),  
(2), (4) Date: Jul. 29, 2010

(87) PCT Pub. No.: WO2009/116133  
PCT Pub. Date: Sep. 24, 2009

(51) Int. Cl.  
*H01S 3/04* (2006.01)

(52) U.S. Cl. .............................. 372/36; 372/34

(58) Field of Classification Search .............. 372/34, 372/36  
See application file for complete search history.

(56) References Cited

U.S. PATENT DOCUMENTS

| 4,603,419 A * | 7/1986 | Shimizu et al. ............ 372/36 |
| 2005/0265410 A1 | 12/2005 | Cho |
| 2007/0019960 A1 * | 1/2007 | Kuwata et al. ............ 398/118 |

FOREIGN PATENT DOCUMENTS

| JP | 58-164285 | | 9/1983 |
| JP | 61201491 A | * | 9/1986 |
| JP | 61-224388 | | 10/1986 |
| JP | 1-236675 A | | 9/1989 |
| JP | 01236675 A | * | 9/1989 |
| JP | 6-152067 A | | 5/1994 |
| JP | 10-116943 A | | 5/1998 |
| JP | 2000-183440 A | | 6/2000 |
| JP | 2004-235212 A | | 8/2004 |
| JP | 2004-235212 A | | 8/2004 |
| JP | 2004235212 A | * | 8/2004 |
| JP | 2005-223302 A | | 8/2005 |
| JP | 2008-034640 | | 2/2008 |

OTHER PUBLICATIONS

International Search Report (PCT/ISA/210) issued on Jun. 24, 2009, by Japanese Patent Office as the International Searching Authority for International Application No. PCT/JP2008/054958.

(Continued)

*Primary Examiner* — Yuanda Zhang  
(74) *Attorney, Agent, or Firm* — Buchanan Ingersoll & Rooney PC (57) ABSTRACT

To obtain a laser light source module, a copper-based material is press-fitted into a through hole formed in a stem made of an iron-based material, thereby forming a first heat sink. A mount made of a copper-based material is fixed to the first heat sink and at least one semiconductor laser device is mounted on the mount. A second heat sink is bonded to lower surfaces of the stem and the first heat sink by a thermal conductive adhesive. An upper surface of the first heat sink is located on a same plane as that of the stem, and a lower surface of the first heat sink is located higher than that of the stem.

5 Claims, 4 Drawing Sheets

OTHER PUBLICATIONS

Written Opinion (PCT/ISA/237) issued on Jun. 24, 2009, by Japanese Patent Office as the International Searching Authority for International Application No. PCT/JP2008/054958.

Extended European Search Report dated Nov. 30, 2011 issued in corresponding European Application No. 08 72 2352.
Notice of Allowance issued by the Korean Patent Office on Apr. 30, 2012 in the corresponding Korean patent application.

* cited by examiner

LASER LIGHT SOURCE MODULE

TECHNICAL FIELD

The present invention relates to a laser light source module having a heat sink.

BACKGROUND ART

A laser light source module uses at least one semiconductor laser device as a light source. In the laser light source module, a light-collecting optical system collects laser beams emitted from the light source, and inputs the laser beams into an optical element such as an optical fiber. To protect the semiconductor laser device from oxidation, a cap is put on the semiconductor laser device or a semiconductor laser array, a lens barrel is located so as to surround the cap, and a light-collecting optical system is provided on a top of the lens barrel.

In a laser light source module having such a configuration, the calorific value from its semiconductor laser device is relatively high, and particularly the calorific value of a semiconductor laser array having a plurality of semiconductor laser devices is considerably high. When a high-power laser light source module using a semiconductor laser array as a light source is continuously used with high power without releasing heat, the semiconductor laser devices are degraded by heat generated by their own, and thus lifetime thereof is shortened considerably. Therefore, it is necessary to provide an efficient heat-releasing mechanism.

If a semiconductor laser array is mounted on a heat sink made of a copper-based material, the heat-releasing efficiency is enhanced; however, when the amount of the copper-based material used in the laser light source module is increased, the mechanical strength of the module is lowered and the cost of the module is increased. For this reason, many laser light source modules employ such a configuration that a semiconductor laser array is mounted on a stem made of an inexpensive iron-based material having high mechanical strength, and a heat sink made of a copper-based material is provided on the stem.

For example, Patent Document 1 discloses a method for manufacturing a stem with a heat sink in which the heat sink having an element-fixing surface is integrally formed on an iron eyelet by press-fitting a copper heat-sink forming material into a through hole or a recess formed in the eyelet. According to this manufacturing method, the heat sink and the eyelet can be integrally formed together without using brazing filler metal.

Patent Document 2 discloses a laser diode package stem in which a coupling groove whose width is increased from the bottom toward the top is formed in a stem, a copper rod member is inserted into the coupling groove, and the rod member is then struck in a row by a predetermined die, thereby expanding the rod member in the coupling groove, fixing the rod member to the stem, and forming the rod member into a heat sink. In the laser diode package stem, a laser diode is mounted on an upper surface of the heat sink.

In the laser light source module having the iron stem and the copper heat sink, because a coefficient of linear expansion of iron and a coefficient of linear expansion of copper are different from each other, a relatively large thermal stress acts on bonded portions between the stem and the heat sink due to temperature rise caused by an operation of the semiconductor laser device. If the heat sink is press-fitted into the stem, it is possible to prevent the stem and the heat sink from being separated from each other by a thermal stress.

Patent Document 1: Japanese Patent Application Laid-open No. H10-116943
Patent Document 2: Japanese Patent Application Laid-open No. 2005-223302

DISCLOSURE OF INVENTION

Problem to be Solved by the Invention

However, according to the stem with the heat sink disclosed in Patent Document 1 and the laser diode package stem disclosed in Patent Document 2, most parts of the copper heat sink are located in or on the stem, and only a very small part is exposed to a lower surface of the stem. Therefore, the heat-releasing efficiency of the heat sink still needs improvement.

Furthermore, according to the laser diode package stem disclosed in Patent Document 2, the copper rod member is struck in a row by a predetermined die to form the heat sink, and the upper surface of the heat sink is used as an element-fixing surface on which the semiconductor laser device (laser diode) is mounted. Therefore, it is difficult to simultaneously enhance both positional precision of the semiconductor laser device in an optical axial direction of the light-collecting optical system and positional precision of the semiconductor laser device in a direction orthogonal to the optical axial direction of the light-collecting optical system.

Even if the positional precision of the semiconductor laser device is low, a laser light source module that uses only one semiconductor laser device as a light source can determine by active alignment a position, at which emitted light intensity is the maximum, of the light-collecting optical system. However, in a case of a laser light source module that uses a semiconductor laser array as a light source, it is difficult to obtain a position, at which emitted light intensity is the maximum, of a light-collecting optical system. Therefore, when the positional precision of an element-fixing surface of the laser light source module that uses the semiconductor laser array as the light source is low, the intensity of light emitted from the laser light source module is lowered, and a connection loss when emitted laser beams enter an optical element such as an optical fiber is increased.

The present invention has been made in view of the above, and an object of the present invention is to provide a laser light source module capable of easily securing desired mechanical strength, easily enhancing heat-releasing efficiency and emitted light intensity, and easily suppressing a connection loss.

Means for Solving Problem

To achieve the object described above, a laser light source module according to the invention includes: a stem that is made of an iron-based material and has a through hole; a first heat sink that is made of a copper-based material and is press-fitted into the through hole of the stem; a mount that is made of a copper-based material and is fixed to the first heat sink; at least one semiconductor laser device that is mounted on an upper surface side of the mount; a lens barrel that is fixed to the stem and surrounds the semiconductor laser device; a light-collecting optical system that is located on a side of a top of the lens barrel and collects laser beams from the semiconductor laser device; and a second heat sink that is bonded to lower surfaces of the stem and the first heat sink by a thermal conductive adhesive, wherein an upper surface of the first heat sink is on a same plane as an upper surface of the stem, and a lower surface of the first heat sink is located higher than a lower surface of the stem.

To achieve the object described above, a laser light source module according to the invention includes: a stem that is made of an iron-based material and has a through hole; a first heat sink that is made of a copper-based material and is press-fitted into the through hole of the stem; a mount that is made of a copper-based material and is fixed to the first heat sink; at least one semiconductor laser device that is mounted on an upper surface side of the mount; a lens barrel that is fixed to the stem and surrounds the semiconductor laser device; a light-collecting optical system that is located on a side of a top of the lens barrel and collects laser beams from the semiconductor laser device; and a second heat sink bonded to lower surfaces of the stem and the first heat sink by a thermal conductive adhesive, wherein the through hole of the stem includes a first through hole portion located on a side of an upper surface of the stem and a second through hole portion connected to the first through hole portion, when the through hole is viewed from above, an inner diameter dimension of the first through hole portion is larger than that of the second through hole portion, a flat surface that is in parallel to the upper surface of the stem is formed around an upper end of the second through hole portion, and an upper surface of the first heat sink is in parallel to the upper surface of the stem, and a lower surface of the first heat sink is located higher than a lower surface of the stem.

Effect of the Invention

According to the laser light source module of the present invention, because the first heat sink and the mount are separate members, it is easy to adjust the position of the semiconductor laser device in a direction orthogonal to the optical axis of the light-collecting optical system. When the laser light source module is designed such that an upper surface of the first heat sink and an upper surface of the stem are on the same plane, it is possible to position the semiconductor laser device in an optical axial direction of the light-collecting optical system by passive alignment using these upper surfaces as reference surfaces. When the laser light source module is designed such that the through hole of the stem includes a first through hole portion and a second through hole portion, it is possible to position the semiconductor laser device in the optical axial direction of the light-collecting optical system by the passive alignment using a flat surface located around an upper end of the second through hole portion as a reference surface.

Further, because the lower surface of the first heat sink is located higher than the lower surface of the stem, a situation does not likely take place in which the second heat sink is bonded to the stem while the upper surface of the second heat sink is inclined from the upper surface of the stem. Therefore, even when the laser light source module is located with reference to the lower surface of the second heat sink, the optical axis of the light-collecting optical system and an optical axis of an optical element such as an optical fiber are not easily deviated from each other.

From these reasons, according to the laser light source module of the present invention, it is easy to enhance the intensity of light emitted from the laser light source module, and it is easy to suppress the connection loss with respect to the optical element such as an optical fiber. Because the laser light source module has a stem made of an iron-based material, it is easy to maintain desired mechanical strength. Further, all of the mount, the first heat sink, and the second heat sink are made of a copper-based material, and a contact area of the heat sink with outside air can be easily increased by appropriately selecting the size of the second heat sink as compared with a case that there is no second heat sink. Therefore, the heat-releasing efficiency can be easily enhanced.

EXPLANATIONS OF LETTERS OR NUMERALS 1, 1A Stem
1a Through hole
1b, 1c Pin insertion hole
3 First heat sink
5 Mount
7 Semiconductor laser array
7a Semiconductor laser device
9 Cap
11, 11A, 11B Lens barrel
11a, 11b Fixing pin
11c Guide unit
13 Light-collecting optical system
15 Second heat sink
17 Thermal conductive adhesive
19 Optical fiber
20 Laser light source module
31 Stem
31a Through hole
$31a_1$ First through hole portion
$31a_2$ Second through hole portion
40 Laser light source module
$US_1$, $US_{31}$ Upper surface of stem
$LS_1$, $LS_{31}$ Lower surface of stem
$US_3$, $US_{33}$ Upper surface of first heat sink
$LS_3$, $LS_{33}$ Lower surface of first heat sink
$US_{15}$ Upper surface of second heat sink
$LS_{15}$ Lower surface of second heat sink
FS Flat surface

BEST MODE(S) FOR CARRYING OUT THE INVENTION

Exemplary embodiments of a laser light source module according to the present invention will be explained below in detail with reference to the accompanying drawings. The present invention is not limited to the embodiments.

First Embodiment

Figure 1:
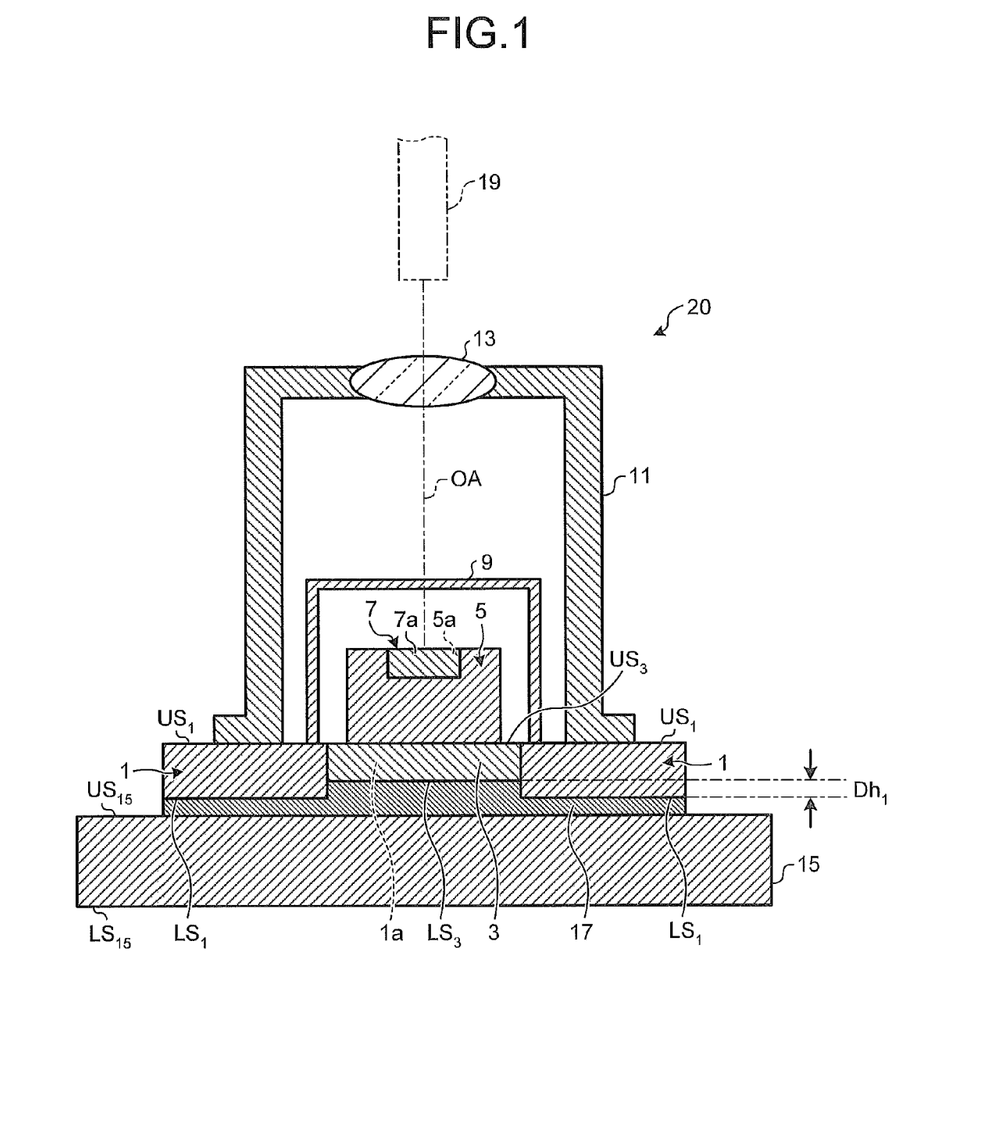
FIG. 1 is a schematic sectional view of an example of a laser light source module according to the present invention.

FIG. 1 is a schematic sectional view of an example of a laser light source module according to the present invention. A laser light source module 20 shown in FIG. 1 includes a stem 1, a first heat sink 3, a mount 5, a semiconductor laser array 7, a cap 9, a lens barrel 11, a light-collecting optical system 13, and a second heat sink 15.

The stem 1 is a flat plate-like member made of an iron-based material, such as iron or steel. A through hole $1a$ is formed in a central portion of the stem 1. The first heat sink 3 is made of a copper-based material, such as copper (Cu) or alloy (CuW) of copper and tungsten. The first heat sink 3 is press-fitted into the through hole $1a$ of the stem 1, and is restrained and held by the stem 1. An upper surface $US_3$ of the first heat sink 3 is on the same plane as an upper surface $US_1$ of the stem 1, and a lower surface $LS_3$ of the first heat sink 3 is located higher than a lower surface $LS_1$ of the stem 1. A height difference $Dh_1$ between the lower surface $LS_1$ of the stem 1 and the lower surface $LS_3$ of the first heat sink 3 with reference to the lower surface $LS_1$ is approximately several tens of nanometers. The upper surface $US_1$ of the stem 1 and the lower surface $LS_1$ of the stem 1 are in parallel to each other.

The mount 5 is made of a copper-based material, and is fixed to the upper surface $US_3$ of the first heat sink 3 using a thermal conductive bonding material (not shown) such as soldering. A recess $5a$ is formed on an upper surface of the mount 5, and the semiconductor laser array 7 is mounted in the recess $5a$. The semiconductor laser array 7 has a plurality of semiconductor laser devices, and is fixed and mounted to the recess $5a$ of the mount 5 by a conductive bonding material (not shown) such as soldering. In FIG. 1, only one semiconductor laser device $7a$ is shown.

The cap 9 is a box-like member for protecting the semiconductor laser devices $7a$ from oxidation. The cap 9 is fixed to the upper surface $US_1$ of the stem 1, and covers the mount 5 and the semiconductor laser array 7. The lens barrel 11 is a cylindrical member fixed to the upper surface $US_1$ of the stem 1 for covering the cap 9, and the light-collecting optical system 13 is located on the top of the lens barrel 11. A position of the light-collecting optical system 13 with respect to the semiconductor laser array 7 and a distance between the semiconductor laser array 7 and the light-collecting optical system 13 are defined by the lens barrel 11.

The light-collecting optical system 13 has a plurality of optical elements such as cylindrical lenses and convex lenses in combination. The light-collecting optical system 13 collects, into an optical waveguide member such as an optical fiber 19 or other optical elements, laser beams emitted from the semiconductor laser devices $7a$ of the semiconductor laser array 7. In FIG. 1, the light-collecting optical system 13 is shown as a convex lens. An optical element such as the optical fiber 19 into which light emitted from the light-collecting optical system 13 enters can be a component of the laser light source module 20, or can be a non-component of the laser light source module 20.

The second heat sink 15 is a flat plate-like member made of a copper-based material and has a size larger than the stem 1 as viewed from above. The second heat sink 15 is bonded to the lower surfaces $LS_1$ and $LS_3$ of the stem 1 and the first heat sink 3 by a thermal conductive adhesive 17. Between the lower surface $LS_1$ of the stem 1 and an upper surface $US_{15}$ of the second heat sink 15, and between the lower surface $LS_3$ of the first heat sink 3 and the upper surface $US_{15}$ of the second heat sink 15, the thermal conductive adhesive 17 is applied to fill in. It is possible to use desired thermal conductive inorganic or organic adhesive, grease, or silicone sheet as the thermal conductive adhesive 17.

In the laser light source module 20 having such a configuration, electricity is supplied to the semiconductor laser array 7 from an external circuit (not shown), and the semiconductor laser devices $7a$ emit laser beams. The laser beams are collected by the light-collecting optical system 13 and enter an optical element such as the optical fiber 19. Heat generated by the laser oscillation of the semiconductor laser device $7a$ is transmitted from the mount 5 to the first heat sink 3, and transmitted to the second heat sink 15 through the thermal conductive adhesive 17, and discharged to outside from the second heat sink 15.

Because the stem 1 is made of an iron-based material, it is easy to maintain desired mechanical strength of the laser light source module 20. Because the laser light source module includes the second heat sink 15 as well as the first heat sink 3, and the mount 5, the first heat sink 3, and the second heat sink 15 are made of a copper-based material, it is easy to enhance the heat-releasing efficiency. For example, while thermal conductivity of iron is 52 W/m·K, thermal conductivity of copper is 384 W/m·K. Therefore, when the first heat sink 3 is made of copper, the quantity of heat transmitted from the mount 5 to the second heat sink 15 is approximately eight times as compared with a case that an iron heat sink is provided instead of the first heat sink 3. By appropriately selecting the size of the second heat sink 15, the contact area of the heat sink with outside air can be easily increased as compared with a case that there is no second heat sink 15, and the heat-releasing efficiency can be easily enhanced.

Because the first heat sink 3 and the mount 5 are separate members, a position of the mount 5 on the first heat sink 3 can be appropriately adjusted in accordance with a position of the lens barrel 11. As a result, it is easy to locate the semiconductor laser array 7 on an optical axis OA (see FIG. 1) of the light-collecting optical system 13 by passive alignment. Because the upper surface $US_1$ of the stem 1 and the upper surface $US_3$ of the first heat sink 3 are on the same plane, it is easy to position the semiconductor laser device $7a$ on the optical axis OA by the passive alignment using the upper surfaces $US_1$ and $US_3$ as reference surfaces.

For example, the mount 5 and the lens barrel 11 are manufactured under predetermined dimension tolerances and geometric tolerances. The semiconductor laser devices $7a$ are mounted on the mount 5, and the light-collecting optical system 13 is located on the lens barrel 11 under predetermined positional tolerances. A position of the mount 5 on the first heat sink 3 and a position of the lens barrel 11 on the stem 1 are determined in advance with reference to alignment marks formed beforehand on the upper surface $US_1$ of the stem 1 as reference points. With this arrangement, the semiconductor laser array 7 is automatically located at a predetermined position on the optical axis OA of the light-collecting optical system 13 only by fixing the mount 5 on which the semiconductor laser array 7 is mounted and the lens barrel 11 on which the light-collecting optical system 13 is located at predetermined positions while using the alignment marks as the reference points. The semiconductor laser array 7 and the light-collecting optical system 13 can be positioned by the passive alignment.

As far as the semiconductor laser array 7 is located at a predetermined position on the optical axis OA, laser beams from the semiconductor laser devices $7a$ enter the light-collecting optical system 13, the laser beams are collected by the light-collecting optical system 13, and are emitted in an efficient manner. Therefore, it is easy to enhance the intensity of light emitted from the light-collecting optical system 13, and it is easy to collect light emitted from the light-collecting optical system 13 into a light incident end of the optical fiber 19.

The lower surface $LS_3$ of the first heat sink 3 is located higher than the lower surface $LS_1$ of the stem 1. Therefore, as compared with a case that the lower surface $LS_3$ of the first heat sink 3 projects from the lower surface $LS_1$ of the stem 1, a situation does not likely take place in which the second heat sink 15 is bonded to the stem 1 in a state that the upper surface $US_{15}$ of the second heat sink 15 is inclined from the upper surface $US_1$ of the stem 1. As a result, as far as the upper surface $US_{15}$ and a lower surface $LS_{15}$ of the second heat sink 15 are formed in parallel to each other in advance, it is possible to prevent the optical axis OA and the optical axis of the optical fiber 19 from being deviated from each other when the laser light source module 20 is arranged with reference to the lower surface $LS_{15}$ of the second heat sink 15. Thus, it is easy to collect light emitted from the light-collecting optical system 13 into the light incident end of the optical fiber 19. Therefore, according to the laser light source module 20, it is also easy to suppress the connection loss of laser beams with respect to the optical fiber 19.

Second Embodiment

The laser light source module according to the present invention can employ a configuration such that a plurality of fixing pins are formed in advance on a lower portion of a lens barrel, the fixing pins are inserted into pin insertion holes formed in a stem, and a relative position of the lens barrel with respect to the stem is defined. In this case, the number of the fixing pins to be formed on the lens barrel can be any desired number of one or more.

Figure 2:
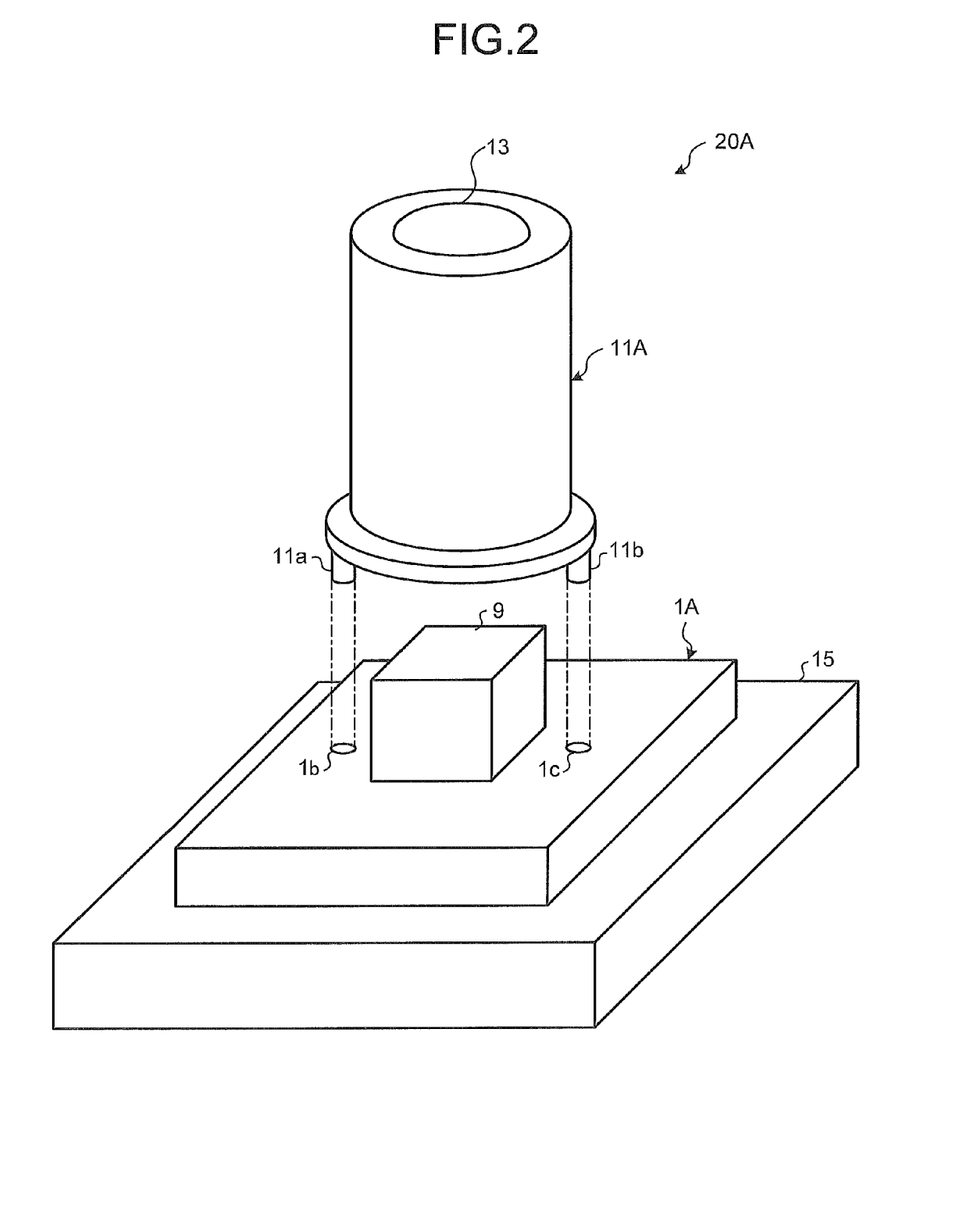
FIG. 2 is a schematic exploded perspective view of an example of a laser light source module that includes a lens barrel having fixing pins on a lower portion thereof according to the present invention.

FIG. 2 is a schematic exploded perspective view of an example of a laser light source module that includes a lens barrel having the fixing pins mentioned above. A laser light source module 20A shown in FIG. 2 includes a stem 1A having two pin insertion holes 1b and 1c and a lens barrel 11A provided at its lower portion with two fixing pins 11a and 11b instead of the stem 1 and the lens barrel 11 shown in FIG. 1. Except these features, the laser light source module 20A has the same configuration as that of the laser light source module 20 shown in FIG. 1. Among components shown in FIG. 2, components that are identical to those shown in FIG. 1 are denoted by like reference numerals as those used in FIG. 1, and explanations thereof will be omitted.

According to the laser light source module 20A, the fixing pins 11a and 11b of the lens barrel 11A are inserted into the pin insertion hole 1b or the pin insertion hole 1c of the stem 1A, and the lens barrel 11A is fixed to the stem 1A. The relative position of the lens barrel 11A with respect to the stem 1A is defined by the two pin insertion holes 1b and 1c and the two fixing pins 11a and 11b. Therefore, when the mount 5 on which the semiconductor laser array 7 is mounted is fixed to the first heat sink 3 (see FIG. 1), the position of the mount 5 can be precisely determined by a method such as an image recognition method with reference to the two pin insertion holes 1b and 1c. It is easy to locate the semiconductor laser array 7 on the optical axis OA (see FIG. 1) of the light-collecting optical system 13 by passive alignment. The laser light source module 20A achieves identical technical effects as those of the laser light source module 20 shown in FIG. 1.

Third Embodiment

According to the laser light source module of the present invention, at least one guide unit that abuts against a side surface of a stem can be formed in advance on a lower portion of a lens barrel, and the relative position of the lens barrel with respect to the stem can be defined by abutting the guide unit against the side surface. The number of the guide units can be any desired number of one or more. When the stem has a plurality of side surfaces, it is preferable that the number and shapes of the guide units are selected so that the guide units abut against the side surfaces of the stem.

Figure 3:
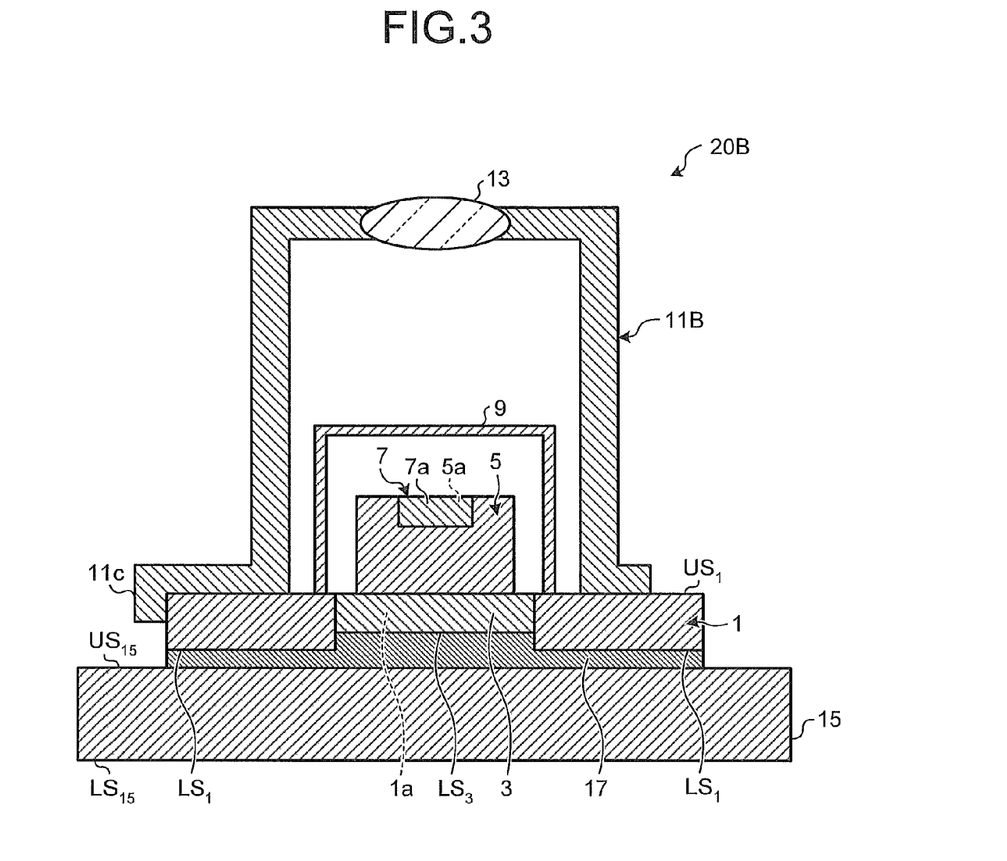
FIG. 3 is a schematic sectional view of an example of a laser light source module that includes a lens barrel having a guide unit on a lower portion thereof according to the present invention.

FIG. 3 is a schematic sectional view of an example of a laser light source module that includes a lens barrel having the guide unit mentioned above. A laser light source module 20B shown in FIG. 3 has a lens barrel 11B provided at its lower portion with a guide unit 11c instead of the lens barrel 11 shown in FIG. 1. Except this feature, the laser light source module 20B has the same configuration as that of the laser light source module 20 shown in FIG. 1. Among components shown in FIG. 3, components that are identical to those shown in FIG. 1 are denoted by like reference numerals as those used in FIG. 1, and explanations thereof will be omitted.

According to the laser light source module 20B, the lens barrel 11B is fixed to the stem 1 in a state that the guide unit 11c of the lens barrel 11B abuts against two side surfaces of the stem 1. The guide unit 11c abuts against the two side surfaces of the stem 1. The relative position of the lens barrel 11B with respect to the stem 1 is defined by the guide unit 11c. Therefore, as far as dimension tolerances and geometric tolerances of the side surfaces of the stem 1 and the guide unit 11c are set in advance precisely, the semiconductor laser array 7 can be located on the optical axis OA (see FIG. 1) of the light-collecting optical system 13 by passive alignment. The laser light source module 20B achieves identical technical effects as those of the laser light source module 20 shown in FIG. 1.

Fourth Embodiment

In a laser light source module according to the present invention, a surface that is different from an upper surface of a stem or an upper surface of a first heat sink can be used as a reference surface for defining a distance between the semiconductor laser device and a light-collecting optical system on an optical axis of the light-collecting optical system. For example, the reference surface can be provided in a region where the first heat sink is formed.

Figure 4:
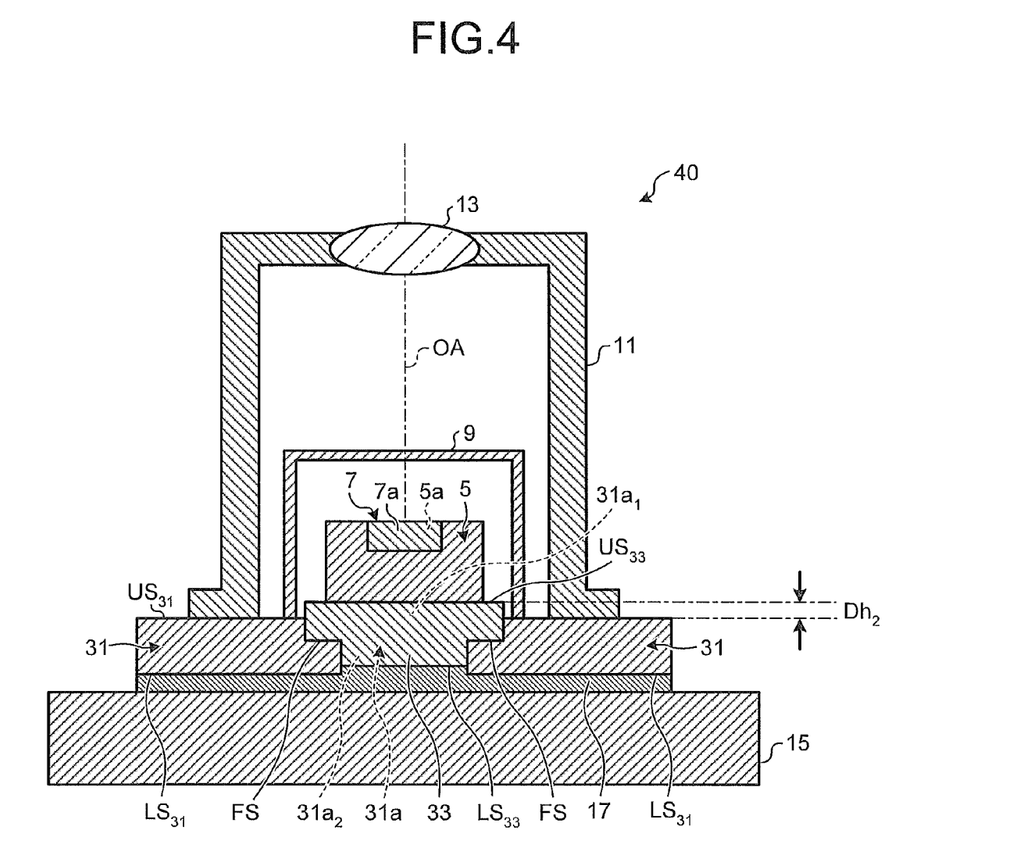
FIG. 4 is a schematic sectional view of an example of a laser light source module having a reference surface for defining a distance between a semiconductor laser device and a light-collecting optical system on an optical axis formed in a region where a first heat sink is formed according to the present invention.

FIG. 4 is a schematic sectional view of an example of a laser light source module having the reference surface mentioned above formed in a region where the first heat sink is formed. A laser light source module 40 shown in FIG. 4 includes stems 31 each having the reference surface FS and a first heat sink 33 formed on the stems 31 instead of the stem 1 and the first heat sink 3 shown in FIG. 1. Except this feature, the laser light source module 40 has the same configuration as that of the laser light source module 20 shown in FIG. 1. Among components shown in FIG. 4, components that are identical to those shown in FIG. 1 are denoted by like reference numerals as those used in FIG. 1, and explanations thereof will be omitted.

The stem 31 has a through hole 31a in which the first heat sink 33 is formed. The through hole 31a includes a first through hole portion $31a_1$ located on the side of an upper surface $US_{31}$ of the stem 31 and a second through hole portion $31a_2$ connected to the first through hole portion $31a_1$. An inner diameter dimension of the first through hole portion $31a_1$ when the through hole 31a is viewed from above is larger than that of the second through hole portion $31a_2$, and a flat surface FS that is in parallel to an upper surface $US_{31}$ of the stem 31 is formed around an upper end of the second through hole portion $31a_2$. This flat surface FS is the reference surface.

The first heat sink 33 is formed by press-fitting a copper-based material into the through hole 31a. An upper surface $US_{33}$ of the first heat sink 33 is in parallel to the upper surface $US_{31}$ of the stem 31, and a lower surface $LS_{33}$ of the first heat sink 33 is located higher than the lower surface $LS_{31}$ of the stem 31 like the laser light source module 20 shown in FIG. 1. The upper surface $US_{33}$ of the first heat sink 33 can be on the same plane as the upper surface $US_{31}$ of the stem 31, or can be on a plane different from the upper surface $US_{31}$ of the stem 31. In the example shown in the drawing, the upper surface $US_{33}$ of the first heat sink 33 is located higher than the upper surface $US_{31}$ of the stem 31.

According to the laser light source module 40, a height difference $Dh_2$ between the upper surface $US_3$, of the stem 31 and the upper surface $US_{33}$ of the first heat sink 33 is obtained using the flat surface FS as the reference surface, and the dimension of the mount 5 and the mounting position of the semiconductor laser array 7 are appropriately adjusted while taking the height difference $Dh_2$ into account. With this configuration, the semiconductor laser array 7 can be located on the optical axis OA of the light-collecting optical system 13 by passive alignment. The laser light source module 40 achieves identical technical effects as those of the laser light source module 20 shown in FIG. 1.

While the laser light source modules according to the present invention have been explained above by exemplary embodiments, the present invention is not limited to these embodiments as mentioned earlier. For example, the light source is not limited to a semiconductor laser array, and can be one semiconductor laser device. The flat surface shapes of members that construct the laser light source module can be appropriately selected. The size of the second heat sink as viewed from above can be equal to or smaller than that of a stem as viewed from above.

A sub-mount can be provided on a base to form a mount. In this case, a semiconductor laser device or a semiconductor laser array is mounted on the sub-mount. It is preferable that the sub-mount is made of a material having high thermal conductivity such as aluminum nitride. Any methods for fixing a lens barrel to the stem can be appropriately selected regardless a position of the reference surface that defines a distance between the semiconductor laser device and the light-collecting optical system on the optical axis of the light-collecting optical system. For example, as in the laser light source module explained in the fourth embodiment, even when the reference surface is provide in a region where a first heat sink is formed, the lens barrel can be fixed to the stem in the same manner as that of the laser light source module explained in the second and third embodiments. As for the laser light source module according to the present invention, as well as those explained above, various changes, modifications, and combinations can be made.

INDUSTRIAL APPLICABILITY

The laser light source module according to the present invention can be used as a light source module in a display device such as a laser television or in a printing device such as a laser printer.

The invention claimed is:

1. A laser light source module comprising:
a stem that is made of an iron-based material and has a through hole;
a first heat sink that is made of a copper-based material and is press-fitted into the through hole of the stem;
a mount that is made of a copper-based material and is arranged on the first heat sink;
at least one semiconductor laser device that is mounted on an upper surface side of the mount;
a lens barrel that is fixed on an upper surface of the stem;
a light-collecting optical system that is fixed in the lens barrel and collects laser beams from the semiconductor laser device; and
a second heat sink that is bonded to lower surfaces of the stem and the first heat sink by a thermal conductive adhesive, wherein
an upper surface of the first heat sink is on a same plane as the upper surface of the stem, and a lower surface of the first heat sink is located higher than a lower surface of the stem,
the upper surface of the stem includes an alignment mark as a reference point, and the mount on the first heat sink and the lens barrel on the stem are fixed at predetermined positions, respectively, with reference to the alignment mark, and
the semiconductor laser device is positioned on an optical axis of the light-collecting optical system based on the upper surfaces of the stem and the first heat sink being on the same plane and used as reference surfaces.

2. The laser light source module according to claim 1, wherein the lens barrel includes at least one guide unit that abuts against a side surface of the stem and defines a relative position of the lens barrel with respect to the stem.

3. The laser light source module according to claim 1, further comprising an optical element into which light emitted from the light-collecting optical system enters.

4. A laser light source module comprising:
a stem that is made of an iron-based material and has a through hole;
a first heat sink that is made of a copper-based material and is press-fitted into the through hole of the stem;
a mount that is made of a copper-based material and is arranged on the first heat sink;
at least one semiconductor laser device that is mounted on an upper surface side of the mount;
a lens barrel that is fixed on an upper surface of the stem;
a light-collecting optical system that is fixed in the lens barrel and collects laser beams from the semiconductor laser device; and
a second heat sink that is bonded to lower surfaces of the stem and the first heat sink by a thermal conductive adhesive, wherein
an upper surface of the first heat sink is on a same plane as the upper surface of the stem, and a lower surface of the first heat sink is located higher than a lower surface of the stem,
the stem has a plurality of pin insertion holes,
the lens barrel includes a plurality of fixing pins formed on a lower portion of the lens barrel,
the fixing pins are fixed to the stem in a state that the fixing pins are inserted into the respective pin insertion holes, and
the mount on the first heat sink is fixed at a predetermined position with reference to the pin insertion holes, and
the semiconductor laser device is positioned on an optical axis of the light-collecting optical system based on the upper surfaces of the stem and the first heat sink being on the same plane and used as reference surfaces.

5. The laser light source module according to claim 4, further comprising an optical element into which light emitted from the light-collecting optical system enters.

* * * * *